(12) United States Patent
Tang et al.

(10) Patent No.: US 10,201,090 B2
(45) Date of Patent: Feb. 5, 2019

(54) FABRICATION METHOD OF CIRCUIT STRUCTURE

(71) Applicant: Siliconware Precision Industries Co., Ltd., Taichung (TW)

(72) Inventors: Shao-Tzu Tang, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/615,158

(22) Filed: Jun. 6, 2017

(65) Prior Publication Data

US 2017/0273185 A1  Sep. 21, 2017

Related U.S. Application Data

(62) Division of application No. 14/453,952, filed on Aug. 7, 2014, now Pat. No. 9,699,910.

(30) Foreign Application Priority Data

Jun. 17, 2014 (TW) .............................. 103120816 A (51) Int. Cl.
*H05K 1/00* (2006.01)
*H05K 3/00* (2006.01)
*H05K 1/11* (2006.01)

(52) U.S. Cl.
CPC ............ *H05K 3/0014* (2013.01); *H05K 1/116* (2013.01); *H05K 2201/09118* (2013.01); *H05K 2201/09545* (2013.01); *H05K 2201/09563* (2013.01); *Y10T 29/49167* (2015.01)

(58) Field of Classification Search
CPC . H05K 1/00; H05K 1/116; H05K 3/14; H05K 3/34; H01L 21/00; H01L 21/48; H01L 21/60; H01L 23/00; H01L 23/48; H01L 23/52; H01L 23/498
USPC ........ 174/264, 250, 257, 158, 258; 438/109, 438/121, 108, 613, 684, 439/77; 257/686, 713, 737, 758, 774; 361/790
See application file for complete search history.

(56) References Cited

U.S. PATENT DOCUMENTS

| | | | | |
|---|---|---|---|---|
| 5,432,999 A | * | 7/1995 | Capps | G11C 5/02 257/E23.011 |
| 5,447,264 A | | 9/1995 | Koopman et al. | |
| 5,471,090 A | * | 11/1995 | Deutsch | H01L 23/5385 257/734 |
| 5,571,973 A | | 11/1996 | Taylot | |
| 5,579,207 A | * | 11/1996 | Hayden | H01L 25/0657 174/261 |
| 6,015,751 A | | 1/2000 | Liu | |
| 6,163,075 A | | 12/2000 | Okushima | |

(Continued)

*Primary Examiner* — Xiaoliang Chen
(74) *Attorney, Agent, or Firm* — Mintz Levin Cohn Ferris Glovsky and Popeo, P.C.; Peter F. Corless; Steven M. Jensen (57) ABSTRACT

A circuit structure is provided, which includes a plurality of conductive posts, and a plurality of first and second conductive pads formed on two opposite end surfaces of the conductive posts, respectively. A length of each of the first conductive pads is greater than a width of the first conductive pad so as to reduce an occupation area of the first conductive pad along the width and increase a distance between adjacent first conductive pads, thereby increasing the wiring density and meeting the wiring demand.

9 Claims, 7 Drawing Sheets

(56) References Cited

U.S. PATENT DOCUMENTS

| | | | |
|---|---|---|---|
| 6,500,760 B1* | 12/2002 | Peterson | H01L 24/29 257/E21.518 |
| 6,536,265 B1 | 3/2003 | Hanchi et al. | |
| 6,946,727 B2* | 9/2005 | Ho | H01L 23/49827 257/698 |
| 7,220,287 B1 | 5/2007 | Wyrzykowska et al. | |
| 8,067,695 B2* | 11/2011 | Kaneko | H01L 23/13 174/250 |
| 9,466,578 B2* | 10/2016 | Fu | H01L 21/486 |
| 2001/0008778 A1* | 7/2001 | Interrante | H01L 24/11 438/108 |
| 2003/0104687 A1* | 6/2003 | Abreu | H01L 23/544 438/613 |
| 2004/0155347 A1* | 8/2004 | Ho | H01L 23/49827 257/758 |
| 2005/0190614 A1 | 9/2005 | Brunette et al. | |
| 2006/0088997 A1 | 4/2006 | Fasano et al. | |
| 2006/0145927 A1* | 7/2006 | Choi | H01Q 1/22 343/700 MS |
| 2006/0172566 A1 | 8/2006 | Nakajima et al. | |
| 2006/0186755 A1 | 8/2006 | Mori et al. | |
| 2006/0258187 A1* | 11/2006 | Behziz | H05K 1/116 439/77 |
| 2007/0278670 A1 | 12/2007 | Kimura et al. | |
| 2008/0185175 A1 | 8/2008 | Tanaka | |
| 2008/0283277 A1 | 11/2008 | Muramatsu et al. | |
| 2009/0002958 A1 | 1/2009 | Li et al. | |
| 2009/0057880 A1* | 3/2009 | Baek | H01L 23/367 257/713 |
| 2009/0102062 A1* | 4/2009 | Sato | H01L 21/563 257/778 |
| 2010/0096738 A1* | 4/2010 | Simmons-Matthews | H01L 21/76898 257/686 |
| 2010/0133688 A1* | 6/2010 | Shigihara | H01L 24/05 257/738 |
| 2010/0175915 A1* | 7/2010 | Mok | H05K 3/107 174/258 |
| 2010/0200898 A1 | 8/2010 | Lin et al. | |
| 2011/0104858 A1* | 5/2011 | Katagiri | H01L 24/97 438/121 |
| 2011/0204515 A1* | 8/2011 | Fazelpour | H01L 23/3114 257/738 |
| 2012/0049345 A1* | 3/2012 | Railkar | H01L 23/3677 257/737 |
| 2012/0119377 A1* | 5/2012 | Muramatsu | H01L 23/49822 257/774 |
| 2012/0261166 A1 | 10/2012 | Oh et al. | |
| 2013/0049137 A1 | 2/2013 | Uno et al. | |
| 2013/0221536 A1* | 8/2013 | Gregorich | H01L 24/13 257/774 |
| 2014/0217579 A1 | 8/2014 | Ganesan et al. | |
| 2015/0061116 A1* | 3/2015 | Lu | H01L 24/13 257/737 |

* cited by examiner

FABRICATION METHOD OF CIRCUIT STRUCTURE

CROSS-REFERENCE TO RELATED APPLICATIONS

This application is a divisional of copending application U.S. Ser. No. 14/453,952, filed on Aug. 7, 2014, which claims under 35 U.S.C. § 119(a) the benefit of Taiwanese Patent Application No. 103120816, filed on Jun. 17, 2014, the entire contents of which are incorporated herein by reference.

BACKGROUND OF THE INVENTION

1. Field of the Invention

The present invention relates to circuit structures and fabrication methods thereof, and more particularly, to a circuit structure and a fabrication method thereof for meeting the miniaturization requirement.

2. Description of Related Art

Along with the rapid development of electronic industries, electronic products are required to be much lighter, thinner, shorter and smaller and multi-functional. Accordingly, there have been developed various types of semiconductor packages and various types of packaging substrates for disposing semiconductor chips. For example, circuit structures can be provided for packaging substrates by using MIS (molded interconnect system) packaging technologies.

Figure 1A:
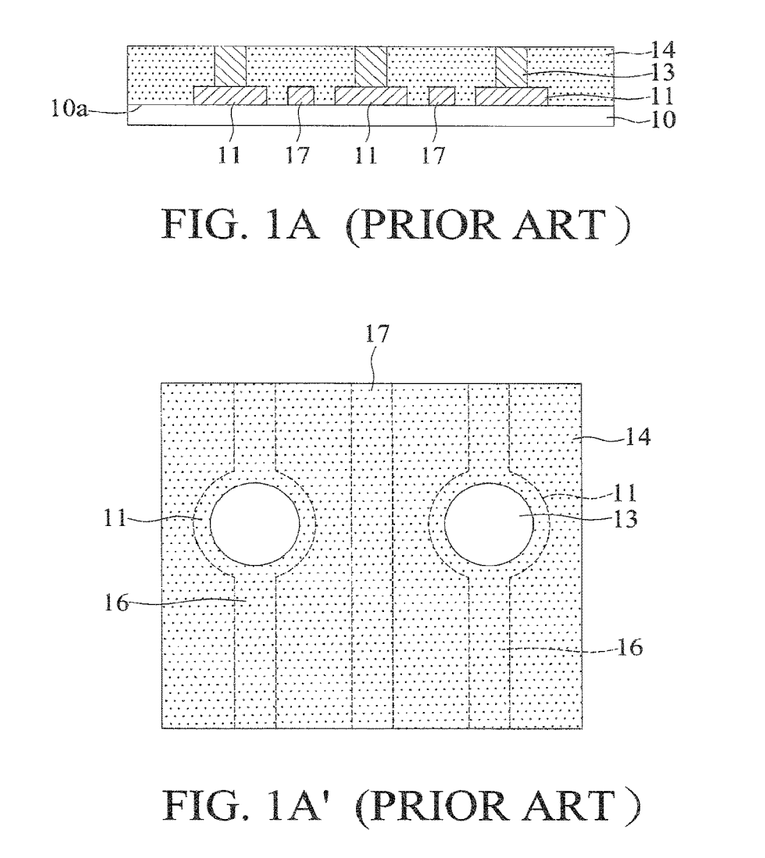
FIGS. 1A to 1C are schematic cross-sectional views showing a method for fabricating a circuit structure according to the prior art, wherein FIG. 1A' is a partially upper view of FIG. 1A, and FIG. 1B' is a perspective view of the circuit structure (not including an encapsulant)
Figure 1B:
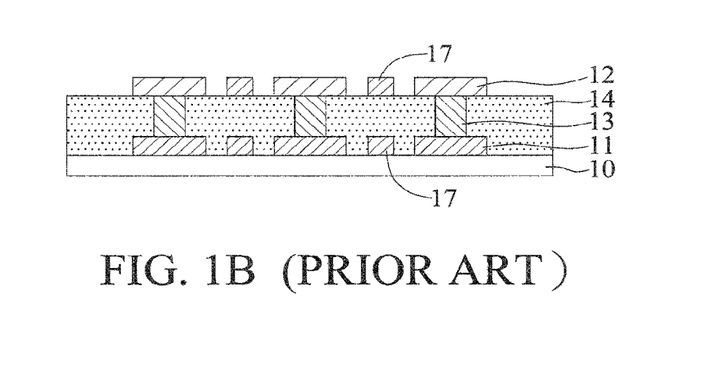
Figure 1C:
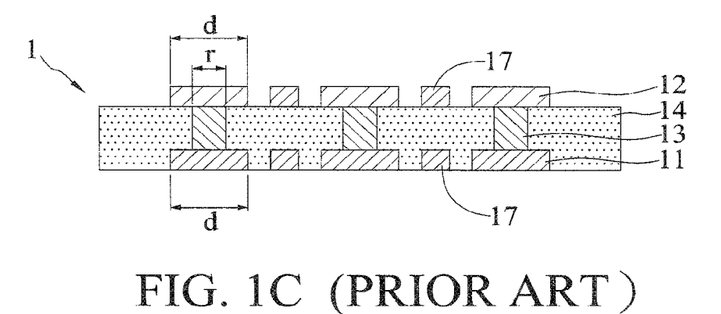

FIGS. 1A to 1C are schematic cross-sectional views showing a method for fabricating a circuit structure 1 by using MIS packaging technologies.

Referring to FIGS. 1A and 1A', a plurality of circuits 16, 17, a plurality of first conductive pads 11 and a plurality of conductive posts 13 are sequentially formed on a surface 10a of a carrier 10. Each of the first conductive pads 11 has a circular shape. Each of the conductive posts 13 has a cylindrical shape. Then, an encapsulant 14 is formed on the surface 10a of the carrier 10 by molding for encapsulating the first conductive pads 11 and the conductive posts 13. Further, surfaces of the conductive posts 13 are exposed from the encapsulant 14.

Referring to FIGS. 1B and 1B', a plurality of circuits 16, 17 are formed on the encapsulant 14 and a plurality of second conductive pads 12 are formed on the exposed surfaces of the conductive posts 13 and the encapsulant 14 around peripheries of the conductive posts 13. Each of the second conductive pads 12 has a circular shape.

Referring to FIG. 1C, the carrier 10 is removed to expose the first conductive pads 11 from the encapsulant 14. As such, a circuit structure 1 is formed. The first and second conductive pads 11, 12 can be used for bonding with solder bumps and solder balls, respectively. Further, each of the conductive posts 13 has a diameter r and each of the first and second conductive pads 11, 12 has a diameter d greater than the diameter r.

However, in the conventional circuit structure 1, since the first and second conductive pads 11, 12 are circular-shaped metal pads and occupy a certain area of the overall wiring space, the wiring of the circuits 16, 17 is limited. For example, a certain distance must be kept between the circuits 17 and the first conductive pads 11, and consequently, only a limited number of the circuits 17 can be formed to pass between two adjacent first conductive pads 11, thereby adversely affecting the wiring flexibility, reducing the wiring density and making it difficult to meet the demands for fine-pitch and multi-joints.

Further, since the diameter d of each of the first and second conductive pads 11, 12 is greater than the diameter r of each of the conductive posts 13, the conductive posts 13 have a smaller-sized path of thermal and electrical conduction compared with the first and second conductive pads 11, 12, thus leading to poor thermal and electrical conductivities of the circuit structure 1.

Therefore, how to overcome the above-described drawbacks has become critical.

SUMMARY OF THE INVENTION

In view of the above-described drawbacks, the present invention provides a circuit structure, which comprises: a plurality of conductive posts each having opposite first and second end surfaces; a plurality of first conductive pads bonded to the first end surfaces of the conductive posts, wherein a length of each of the first conductive pads is greater than a width of the first conductive pad; and a plurality of second conductive pads bonded to the second end surfaces of the conductive posts.

The present invention further provides a method for fabricating a circuit structure, which comprises the steps of: forming a plurality of first conductive pads on a carrier, wherein a length of each of the first conductive pads is greater than a width of the first conductive pad; forming a plurality of conductive posts on the first conductive pads, wherein each of the conductive posts has opposite first and second end surfaces and the first conductive pads are bonded to the first end surfaces of the conductive posts; and forming a plurality of second conductive pads on the second end surfaces of the conductive posts.

After forming the second conductive pads, the above-described method can further comprise removing the carrier.

In the above-described structure and method, each of the first conductive pads has a polygonal shape or an asymmetric geometric shape. For example, each of the first conductive pads has a quadrilateral shape or a rounded elongated shape.

In the above-described structure and method, each of the first conductive pads is less in area than the first end surface of the corresponding conductive post.

In the above-described structure and method, a length of each of the second conducive pads is greater than a width of the second conductive pad. For example, each of the second conductive pads has a polygonal shape or an asymmetric geometric shape. In particular, each of the second conductive pads has a quadrilateral shape or a rounded elongated shape.

In the above-described structure and method, each of the second conductive pads is less in area than the second end surface of the corresponding conductive post.

After forming the conductive posts, the method can further comprise forming an insulating layer on the carrier for encapsulating the conductive posts. For example, the insulating layer is an encapsulant. The insulating layer can further encapsulate the first conductive pads. In an embodiment, the second conductive pads are formed first and then the insulating layer is formed to encapsulate the second conductive pads. In another embodiment, the insulating layer is formed before the second conductive pads are formed.

According to the present invention, the length of each of the first conductive pads is greater than the width of the first conductive pad so as to reduce an occupation area of the first conductive pad along an axial direction and increase a distance between adjacent first conductive pads. As such, the wiring space is increased. For example, the number of circuits passing between two adjacent first conductive pads is increased. Therefore, the present invention increases the wiring density and meets the demands for fine-pitch and multijoints.

Further, since each of the first and second conductive pads can be less in area than the end surface of the corresponding conductive post, the conductive post has a larger-sized path of thermal and electrical conduction relative to the first and second conductive pads. As such, the circuit structure of the present invention achieves preferred thermal and electrical conductivities.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2F are schematic cross-sectional views showing a method for fabricating a circuit structure 2 according to the present invention.

Figure 2A:
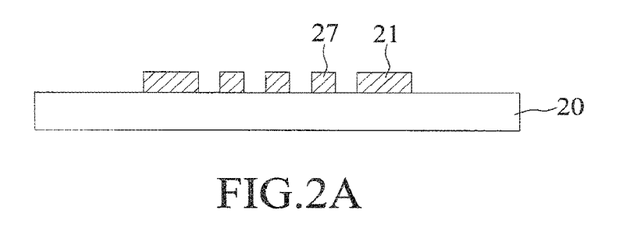
FIGS. 2A to 2F are schematic cross-sectional views showing a method for fabricating a circuit structure according to the present invention, wherein FIG. 2A' is an upper view of FIG. 2A, FIG. 2D' shows another embodiment of FIG. 2D, and FIGS. 2F' and 2F" show other embodiments of FIG. 2F.

Referring to FIGS. 2A and 2A', a patterned first metal layer is formed on a carrier 20. The first metal layer has a plurality of circuits 26, 27 and a plurality of first conductive pads 21 connected to the circuits 26.

In the present embodiment, each of the first conductive pads 21 has a length Y and a width X and the length Y is greater than the width X. As such, the first conductive pad 21 has a rounded elongated shape, for example, an oval shape. Therefore, an occupation area of the first conductive pad 21 along an axial direction (i.e., the width X direction) is reduced and a distance between adjacent first conductive pads 21 is increased, thereby increasing the wiring space. For example, compared with the prior art that only allows one circuit to pass between two adjacent conductive pads, the present invention allows a plurality of circuits 27 (for example, three circuits) to pass between two adjacent first conductive pads 21.

Figure 3A:
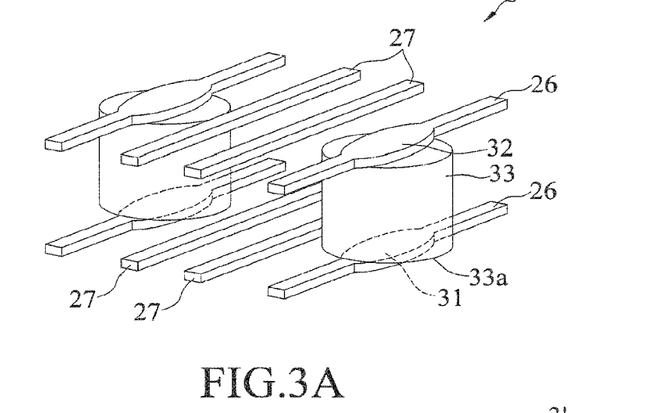
FIGS. 3A to 3C are schematic perspective views showing different embodiments of the circuit structure of the present invention.
Figure 3B:
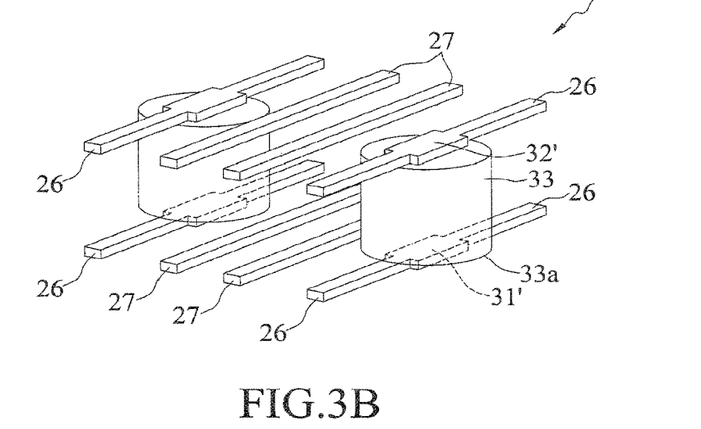
Figure 3C:
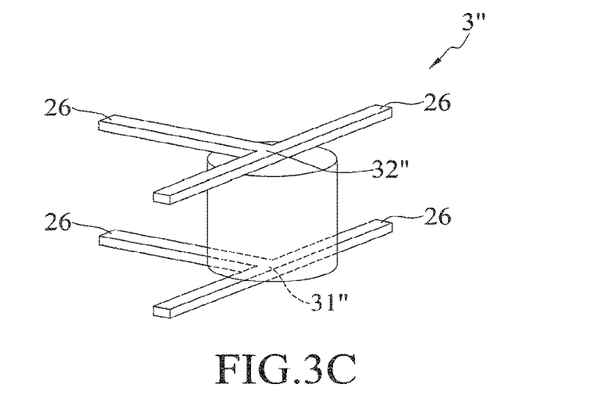

In other embodiments, referring to FIGS. 3A to 3C, each of the first conductive pads 31, 31', 31" has a polygonal shape, for example, a quadrilateral shape or a rounded elongated shape, or an asymmetric geometric shape, for example, a T-shape or a curved shape.

Further, referring to FIG. 3C, the first conductive pad 31" serves as both a heat dissipating pad and a power source pad. Therefore, a chip (not shown) only needs a single electrode pad to be electrically connected to the first conductive pad 31".

Figure 2B:
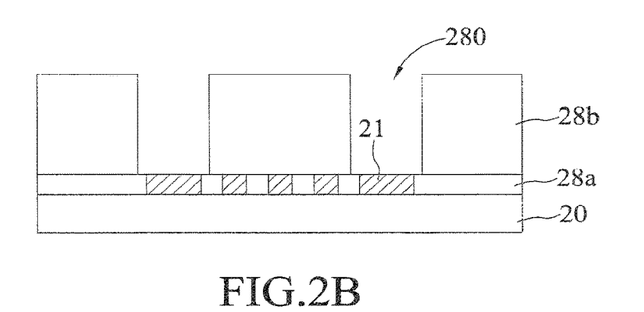

Referring to FIG. 2B, a first photoresist layer 28a is formed on the carrier 20 for encapsulating the first conductive pads 21, and surfaces of the first conductive pads 21 are exposed from the first photoresist layer 28a. Then, a second photoresist layer 28b is formed on the first photoresist layer 28a. The second photoresist layer 28b has a plurality of open areas 280 corresponding in position to the first conductive pads 21 so as to expose the surfaces of first conductive pads 21.

Figure 2C:
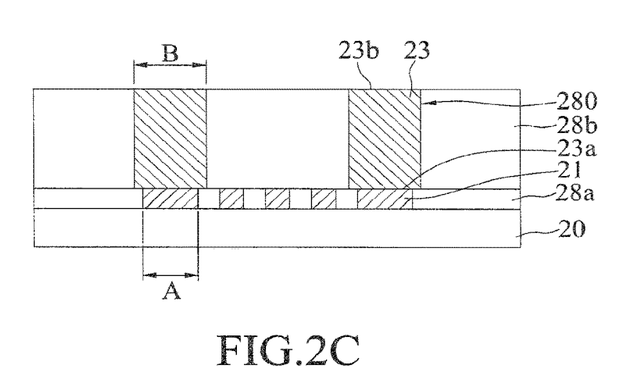

Referring to FIG. 2C, a plurality of conductive posts 23 are formed on the first conductive pads 21 in the open areas 280. Each of the conductive posts 23 has a first end surface 23a and a second end surface 23b opposite to the first end surface 23a. The first conductive pads 21 are bonded to the first end surfaces 23a of the conductive posts 23.

In the present embodiment, the conductive posts 23 are copper cylinders. An area A of each of the first conductive pads 21 is less than an area B of the first end surface 23a of the corresponding conductive post 23. Therefore, the conductive post 23 has a larger-sized path of thermal and electrical conduction compared with the first conductive pad 21, thereby improving heat dissipation and electrical conduction effects of the conductive post 23.

Referring to FIGS. 3A to 3C, each of the first conductive pads 31, 31', 31" of different shapes is less in area than the first end surface 33a of the corresponding conductive post 33.

Figure 2D:
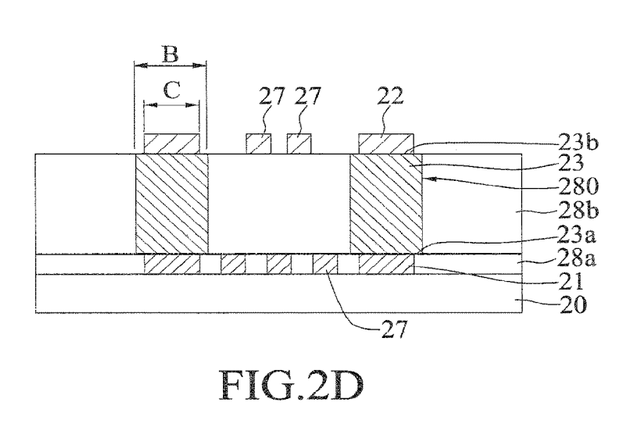

Referring to FIGS. 2D and 3A, a patterned second metal layer is formed on the second end surfaces 23b of the conductive posts 23. The second metal layer has a plurality of circuits 26, 27 and a plurality of second conductive pads 22, 32 connected to the circuits 26 and bonded to the second end surfaces 23b of the conductive posts 23.

In the present embodiment, referring to FIG. 2D and FIGS. 3A to 3C, the second conductive pads 22, 32, 32', 32" have a shape similar to the first conductive pads 21, 31, 31', 31". For example, each of the second conductive pads has a polygonal shape, for example, a quadrilateral shape or a rounded elongated shape, or an asymmetric geometric shape.

An area C of each of the second conductive pads 22 is less than the area B of the second end surface 23b of the corresponding conductive post 23. In another embodiment, referring to FIG. 2D', an area C' of each of the second conductive pads 22' is greater than the area B of the second end surface 23b of the corresponding conductive post 23.

Figure 2E:
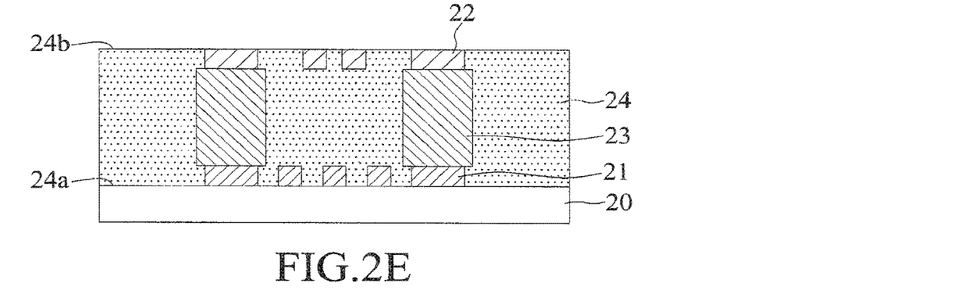

Referring to FIG. 2E, continued from FIG. 2D, the first and second photoresist layers 28a, 28b are removed and then a molding process is performed to form an insulating layer 24, such as an encapsulant, on the carrier 20. The insulating layer 24 encapsulates the first conductive pads 21, the conductive posts 23 and the second conductive pads 22.

In the present embodiment, the insulating layer 24 has opposite first and second sides 24a, 24b. The first conductive pads 21 are positioned at the first side 24a of the insulating layer 24. The conductive posts 23 are positioned in the insulating layer 24. The second conductive pads 22 are positioned at the second side 24b of the insulating layer 24.

Further, the first conductive pads 21 are embedded in the first side 24a of the insulating layer 24 and the second conductive pads 22 are embedded in the second side 24b of the insulating layer 24.

Figure 2F:
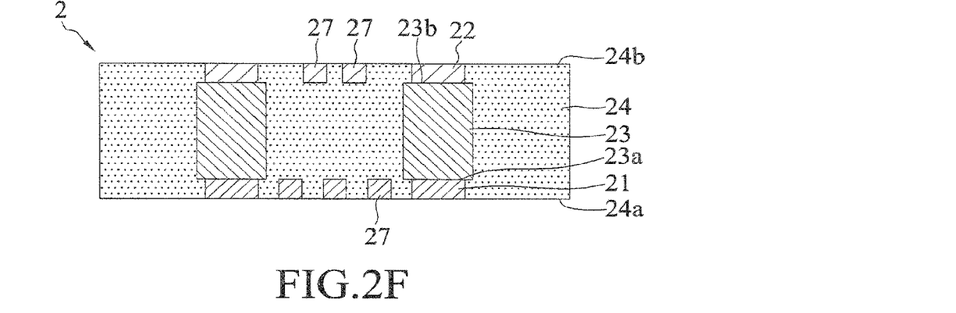

Referring to FIG. 2F, the carrier 20 is removed to expose the first conductive pads 21 from the first side 24a of the insulating layer 24.

In another embodiment, referring to FIG. 2F', a circuit structure 2' is formed according to the process of FIG. 2D'.

Referring to FIG. 2F", the first and second photoresist layers 28a, 28b are removed first and then a molding process is performed. Thereafter, a plurality of second conductive pads 22" are formed on the second end surfaces 23b of the conductive posts 23 and positioned on the second side 24b of the insulating layer 24.

According to the present invention, the length Y of each of the first conductive pads 21 is greater than the width X of the first conductive pad 21 so as to reduce an occupation area of the first conductive pad 21 along an axial direction and increase a distance between adjacent first conductive pads 21. Therefore, the present invention increases the wiring space and density and meets the wiring demand.

Similarly, an occupation area of each of the second conductive pads 22 along an axial direction can be reduced to achieve the same effect. For example, a plurality of circuits 27 (for example, two circuits) are allowed to pass between two adjacent second conductive pads 22 in FIG. 2F, while only one circuit 27 is allowed to pass between two adjacent second conductive pads 22' in FIG. 2F'.

Further, the area A of each of the first conductive pads 21 is less than the area B of the first end surface 23a of the corresponding conductive post 23. In addition, the area C of each of the second conductive pads 22 can be less than the area B of the second end surface 23b of the corresponding conductive post 23. As such, the conductive post 23 has a larger-sized path of thermal and electrical conduction relative to the first and second conductive pads 21, 22. Therefore, the circuit structure 2 has preferred thermal and electrical conductivities.

Figure 4:
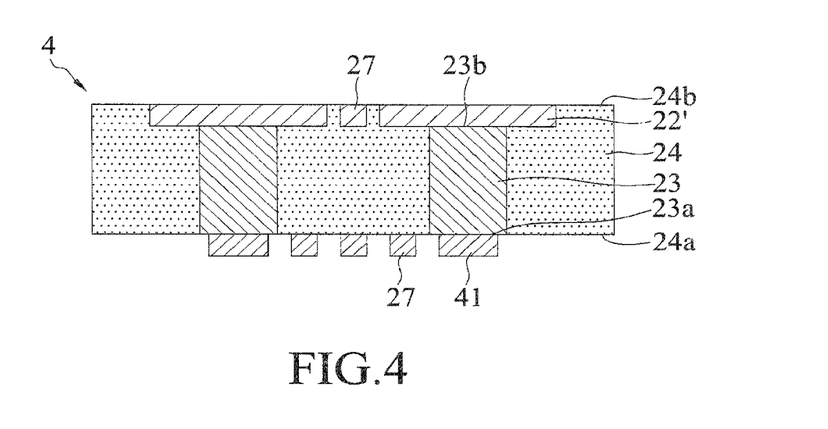
FIGS. 4 and 4' are schematic cross-sectional views showing a method for fabricating a circuit structure according to another embodiment of the present invention.

In an embodiment, referring to FIG. 4, first, the second photoresist layer 28b is removed and the second conductive pads 22' and the insulating layer 24 are formed. Then, the first photoresist layer 28a and the carrier 20 are removed. As such, the first conductive pads 41 are positioned on the first side 24a of the insulating layer 24.

In another embodiment, referring to FIG. 4', a support member 29 is further disposed on the first side 24a of the insulating layer 24. For example, a hard member is provided after the carrier 20 is removed, or the support member 29 is directly fabricated from the carrier 20.

The present invention further provides a circuit structure 2, 2', 2", 3, 3', 3", 4, 4', which has: a plurality of conductive posts 23, 33 each having opposite first and second end surfaces 23a, 23b; a plurality of first conductive pads 21, 31, 31', 31" bonded to the first end surfaces 23a of the conductive posts 23, 33, wherein a length Y of each of the first conductive pads 21, 31, 31', 31" is greater than a width X of the first conductive pad 21, 31, 31', 31"; and a plurality of second conductive pads 22, 22', 22", 32, 32', 32" bonded to the second end surfaces 23b of the conductive posts 23, 33.

Each of the first conductive pads 21, 31, 31', 31" can have a quadrilateral shape, a rounded elongated shape (for example, an oval shape) or an asymmetric geometric shape (for example, a T-shape).

A length of each of the second conductive pads 22, 22', 22", 32, 32', 32" can be greater than a width of the second conductive pad 22, 22', 22", 32, 32', 32". For example, each of the second conductive pads 22, 22', 22", 32, 32', 32" has a polygonal shape or an asymmetric geometric shape (for example, a T-shape).

In an embodiment, an area A of each of the first conductive pads 21, 31, 31', 31" is less than an area B of the first end surface 23a of the corresponding conductive post 23.

In an embodiment, an area C of each of the second conductive pads 22 is less than an area B of the second end surface 23b of the corresponding conductive post 23.

In an embodiment, the circuit structure 2, 2', 2", 4, 4' further has an insulating layer 24, for example, an encapsulant. The insulating layer 24 has opposite first and second sides 24a, 24b. The first conductive pads 21 are embedded in the first side 24a of the insulating layer 24. The conductive posts 23 are positioned in the insulating layer 24. The second conductive pads 22" are positioned on the second side 24b of the insulating layer 24. Alternatively, the second conductive pads 22, 22' are embedded in the second side 24b of the insulating layer 24.

According to the present invention, the length of each of the conductive pads can be greater than the width of the conductive pad so as to reduce an occupation area of the conductive pad along an axial direction and increase a distance between adjacent conductive pads. Therefore, the present invention increases the wiring space and density and meets the demands for fine-pitch and multi-joints.

Further, since each of the conductive pads can be less in area than the end surface of the corresponding conductive post, the conductive post has a larger-sized path of thermal and electrical conduction compared with the conductive pad. As such, the circuit structure of the present invention achieves preferred thermal and electrical conductivities.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a circuit structure, comprising the steps of:
    forming a plurality of first conductive pads on a carrier, wherein a length of each of the first conductive pads is greater than a width of the first conductive pad;
    forming a plurality of conductive posts on the first conductive pads, wherein each of the conductive posts has opposite first and second end surfaces and the first conductive pads are bonded to the first end surfaces of the conductive posts;
    forming a plurality of second conductive pads on the second end surfaces of the conductive posts; and
    after forming the second conductive pads, forming an insulating layer on the carrier for encapsulating the conductive posts.

2. The method of claim 1, wherein each of the first conductive pads has a polygonal shape or an asymmetric geometric shape.

3. The method of claim 2, wherein each of the first conductive pads has a quadrilateral shape or a rounded elongated shape.

4. The method of claim 1, wherein each of the first conductive pads is less in area than the first end surface of the corresponding conductive post.

5. The method of claim 1, wherein a length of each of the second conducive pads is greater than a width of the second conductive pad.

6. The method of claim 1, wherein each of the second conductive pads has a polygonal shape or an asymmetric geometric shape.

7. The method of claim 6, wherein each of the second conductive pads has a quadrilateral shape or a rounded elongated shape.

8. The method of claim 1, wherein each of the second conductive pads is less in area than the second end surface of the corresponding conductive post.

9. The method of claim 1, after forming the second conductive pads, further comprising removing the carrier.

* * * * *